(12) United States Patent
Chen et al.

(10) Patent No.: US 9,474,182 B1
(45) Date of Patent: Oct. 18, 2016

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Hsiao-Han Lu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 21 days.

(21) Appl. No.: 14/668,995

(22) Filed: Mar. 26, 2015

(51) Int. Cl.
| | |
|---|---|
| *A47B 88/10* | (2006.01) |
| *H05K 7/18* | (2006.01) |
| *A47B 96/06* | (2006.01) |
| *A47B 96/07* | (2006.01) |
| *F16L 3/015* | (2006.01) |

(52) U.S. Cl.
CPC .............. *H05K 7/183* (2013.01); *A47B 88/10* (2013.01); *A47B 96/067* (2013.01); *A47B 96/07* (2013.01); *F16L 3/015* (2013.01)

(58) Field of Classification Search
CPC .... H05K 7/183; A47B 96/067; A47B 96/07; A47B 88/10; A47B 88/044; A47B 88/14; F16L 3/015
USPC ................ 248/241; 211/26; 312/333, 334.47
See application file for complete search history.

(56) References Cited

U.S. PATENT DOCUMENTS

| | | | |
|---|---|---|---|
| 6,303,864 B1 | 10/2001 | Johnson | |
| 7,554,819 B2 | 6/2009 | Chen | |
| 7,648,214 B2 * | 1/2010 | Chen | A47B 88/10 312/333 |
| 7,699,415 B2 * | 4/2010 | Tseng | A47B 88/10 312/333 |
| 7,712,615 B2 | 5/2010 | Chen | |
| 7,746,667 B1 | 6/2010 | Baiza | |
| 7,798,582 B2 * | 9/2010 | Yu | A47B 88/044 211/26 |
| 8,186,634 B2 | 5/2012 | Chen | |
| 8,231,014 B2 | 7/2012 | Chen | |
| 8,251,321 B2 | 8/2012 | Chen | |
| 8,528,999 B2 * | 9/2013 | Chen | A47B 88/14 312/333 |
| 8,634,198 B2 | 1/2014 | Chen | |
| 8,833,715 B2 | 9/2014 | Chen | |
| 2010/0008608 A1 | 1/2010 | Chen | |

FOREIGN PATENT DOCUMENTS

EP   2 632 240 A2   8/2013

\* cited by examiner

*Primary Examiner* — Anita M King
(74) *Attorney, Agent, or Firm* — Winston Hsu; Scott Margo

(57) ABSTRACT

A slide rail assembly includes a first rail, a first connection base, a second rail and a second connection base. The first rail includes two first sidewalls and a first lateral wall connected between the two first sidewalls. A first passage is defined by the two first sidewalls and the first lateral wall along a first direction. The first connection base is movably connected to the first rail and is movable relative to the first rail between a first position and a second position in the first passage, and configured to connect to a first arm of a cable management device. The second rail is capable of moving relative to the first rail along the first direction. The second connection base is connected to the second rail, and configured to connect to a second arm of the cable management device movably connected to the first arm.

14 Claims, 13 Drawing Sheets

SLIDE RAIL ASSEMBLY

BACKGROUND OF THE INVENTION

1. Field of the Invention

The present invention relates to a slide rail assembly, and more particularly, to a slide rail assembly capable of allowing both ends of a cable management device to move with a chassis when the chassis is drawn out.

2. Description of the Prior Art

A slide rail assembly may comprise an outer rail, a middle rail and an inner rail movably connected to each other for being extended or retracted. Both ends of the outer rail can be attached to a rack for supporting the slide rail assembly. The middle rail is movably connected between the outer rail and the inner rail for supporting the inner rail when the inner rail is pulled out. The inner rail can carry a device, such as a chassis, such that the slide rail assembly can allow the chassis to be stored in the rack or drawn out from the rack.

Generally, a cable management device is provided on the slide rail assembly for securing cables between the rack and the chassis. When the travel distance of the slide rail assembly is increased, a longer cable management device is required. In order to prevent the cable management device from sagging downward, U.S. Pat. No. 7,746,667 discloses a slide rail assembly comprising a support member for supporting a cable management device. However, the support member may increase complexity of structure of the slide rail assembly, and further increase difficulty for installing the slide rail assembly.

SUMMARY OF THE INVENTION

The present invention provides a slide rail assembly comprising a first rail, a first connection base, a second rail and a second connection base. The first rail defines a first passage along a first direction. The first connection base is movably connected to the first rail and is movable relative to the first rail between a first position and a second position in the first passage. The second rail is capable of moving relative to the first rail along the first direction. The second connection base is connected to the second rail.

Preferably, the first rail comprises two first sidewalls and a first lateral wall connected between the two first sidewalls, the first passage being defined by the two first sidewalls and the first lateral wall, and the slide rail assembly further comprises a middle rail movably connected to the first rail and movable relative to the first rail in the first passage, the middle rail comprises two second sidewalls and a second lateral wall connected between the two second sidewalls, and a second passage is defined by the two second sidewalls and the second lateral wall along the first direction, wherein the second rail is movably connected to the middle rail and movable relative to the middle rail in the second passage.

Preferably, the first connection base comprises an elastic arm configured to engage with the middle rail, and a releasing unit is arranged on the first rail for releasing the elastic arm from the middle rail when the first connection base is at the second position.

Preferably, the first connection base further comprises an abutting portion configured to abut against the middle rail.

Preferably, the first rail further comprises a stopper for stopping the first connection base when the first connection base is at the second position.

The present invention further provides a slide rail assembly comprising a first rail, a first connection base, a second rail and a second connection base. The first rail comprises two first sidewalls and a first lateral wall connected between the two first sidewalls. A first passage is defined by the two first sidewalls and the first lateral wall along a first direction. The first connection base is movably connected to the first rail and is movable relative to the first rail in the first passage, the first connection base is configured to connect to a first arm of a cable management device. The second rail is capable of moving relative to the first rail along the first direction. The second connection base is connected to the second rail, and configured to connect to a second arm of the cable management device movably connected to the first arm, wherein when the second rail is moved a predetermined distance outward along the first direction, the first connection base is pulled by the second rail through the cable management device to move from a first position toward a second position in the first passage.

The present invention further provides a slide rail assembly, configured to install a chassis on a rack, the slide rail assembly comprising a first rail, a first bracket, a second bracket, a first connection base, a middle rail, a second rail and a second connection base. The first rail comprises two first sidewalls and a first lateral wall connected between the two first sidewalls. A first passage is defined by the two first sidewalls and the first lateral wall along a first direction. The first bracket is connected to a first end of the first rail, and configured to attach to a first post of the rack. The second bracket is connected to a second end of the first rail, and configured to attach to a second post of the rack. The first connection base is movably connected to the first rail and is movable relative to the first rail in the first passage, the first connection base is configured to connect to a first arm of a cable management device. The middle rail is movably connected to the first rail and is movable relative to the first rail in the first passage, and the middle rail comprises two second sidewalls and a second lateral wall connected between the two second sidewalls. A second passage is defined by the two second sidewalls and the second lateral wall along the first direction. The second rail is movably connected to the middle rail and is movable relative to the middle rail in the second passage, the chassis being mounted on the second rail. The second connection base is connected to the second rail, and configured to connect to a second arm of the cable management device movably connected to the first arm, wherein when the second rail is moved a predetermined distance outward along the first direction, the first connection base is pulled by the second rail through the cable management device to move from a first position toward a second position in the first passage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
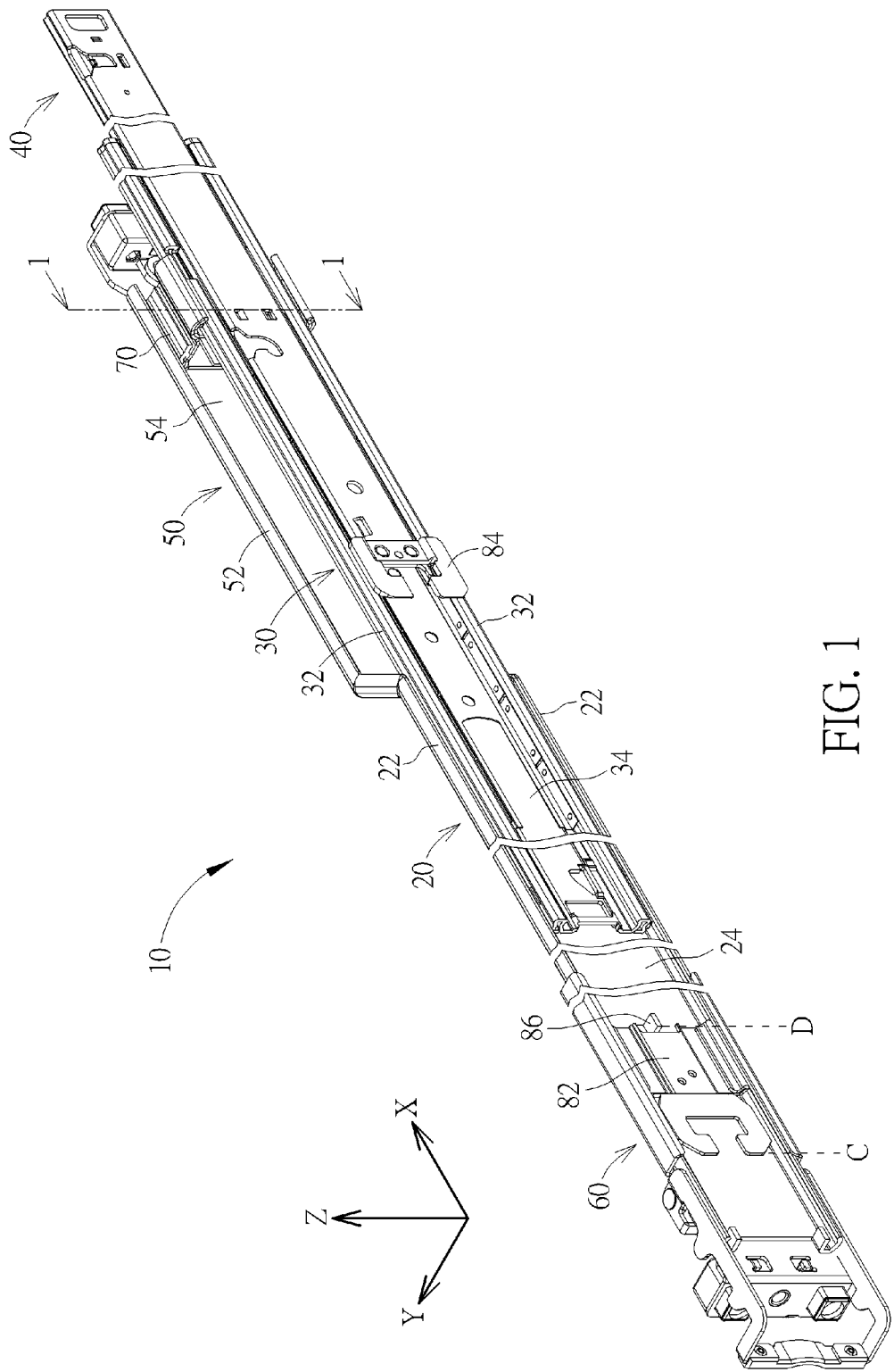
FIG. 1 is a diagram showing a slide rail assembly of an embodiment of the present invention.
Figure 2:
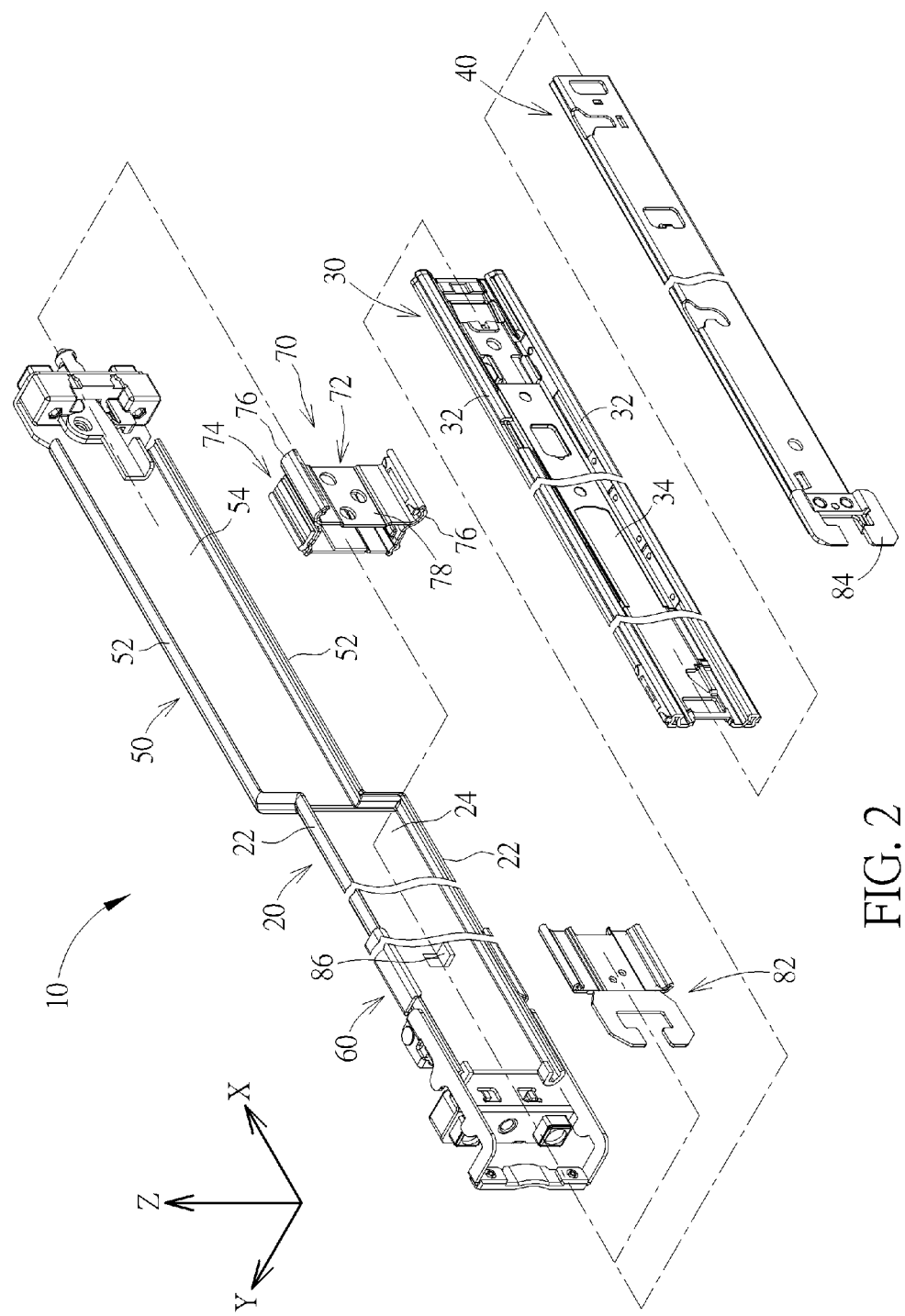
FIG. 2 is an exploded view of the slide rail assembly of an embodiment of the present invention.

FIG. 1 is a diagram showing a slide rail assembly of an embodiment of the present invention. FIG. 2 is an exploded view of the slide rail assembly of an embodiment of the present invention. The slide rail assembly 10 comprises an outer rail 20, a middle rail 30, an inner rail 40, a first connection base 82 and a second connection base 84. The outer rail 20 comprises two first sidewalls 22 and a first lateral wall 24 connected between the two first sidewalls 22. A first passage is defined by the two first sidewalls 22 and the first lateral wall 24 along a first direction X (a longitudinal direction of the slide rail assembly 10). The middle rail 30 is movably connected to the outer rail 20 and is movable relative to the outer rail 20 in the first passage. The middle rail 30 comprises two second sidewalls 32 and a second lateral wall 34 connected between the two second sidewalls 32. A second passage is defined by the two second sidewalls 32 and the second lateral wall 34 along the first direction X. The inner rail 40 is movably connected to the middle rail 30 and is movable relative to the middle rail 30 in the second passage. The first connection base 82 is movably connected to the outer rail 20 and is movable relative to the outer rail 20 between a position C and a position D in the first passage. The second connection base 84 is connected to the inner rail 40.

The slide rail assembly 10 further comprises a first bracket 50 and a second bracket 60. The first bracket 50 is connected to a first end of the outer rail 20. The second bracket 60 is connected to a second end of the outer rail 20.

Figure 3:
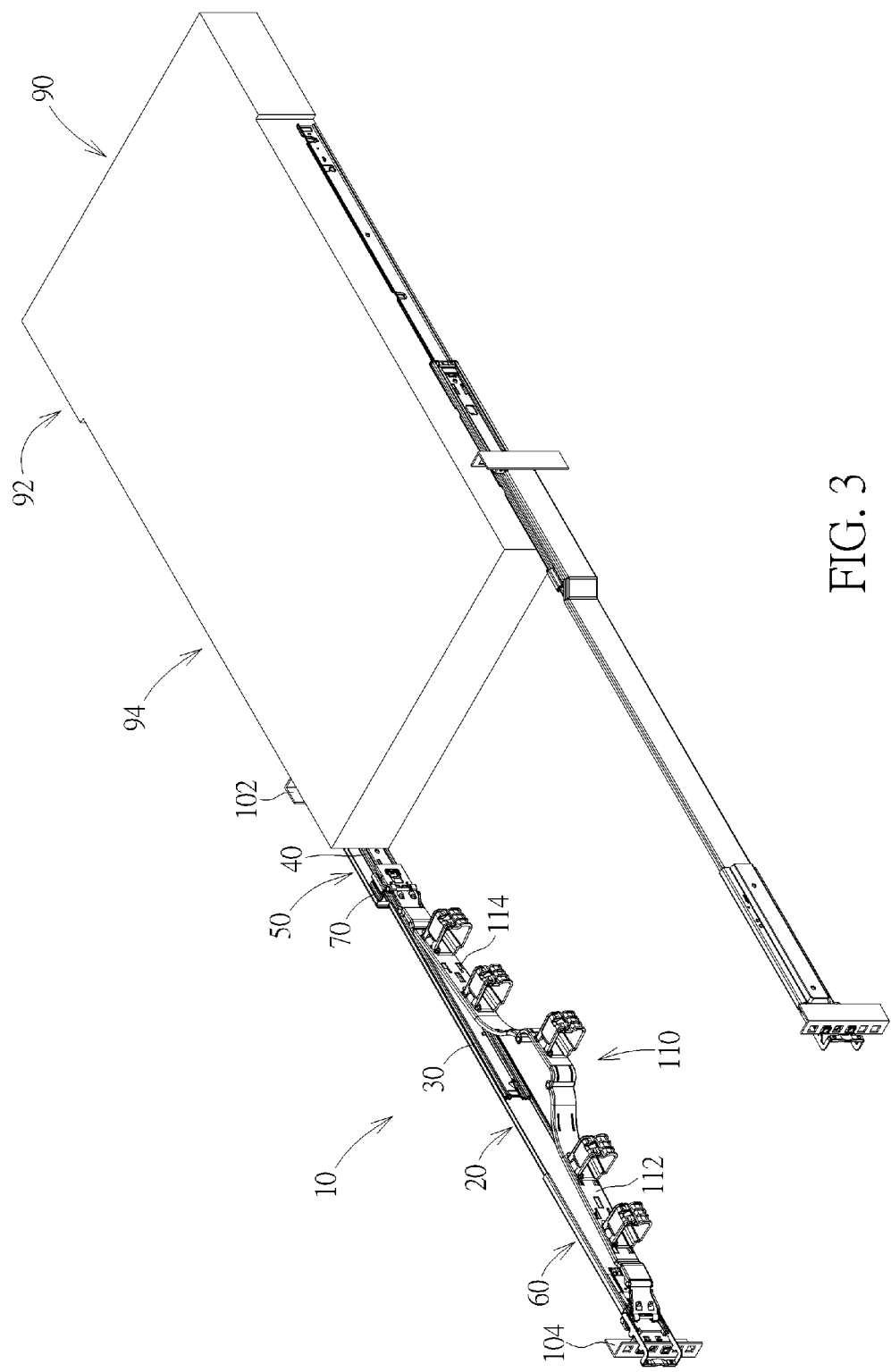
FIG. 3 is a diagram showing the slide rail assembly of an embodiment of the present invention configured to install a chassis onto a rack.
Figure 4:
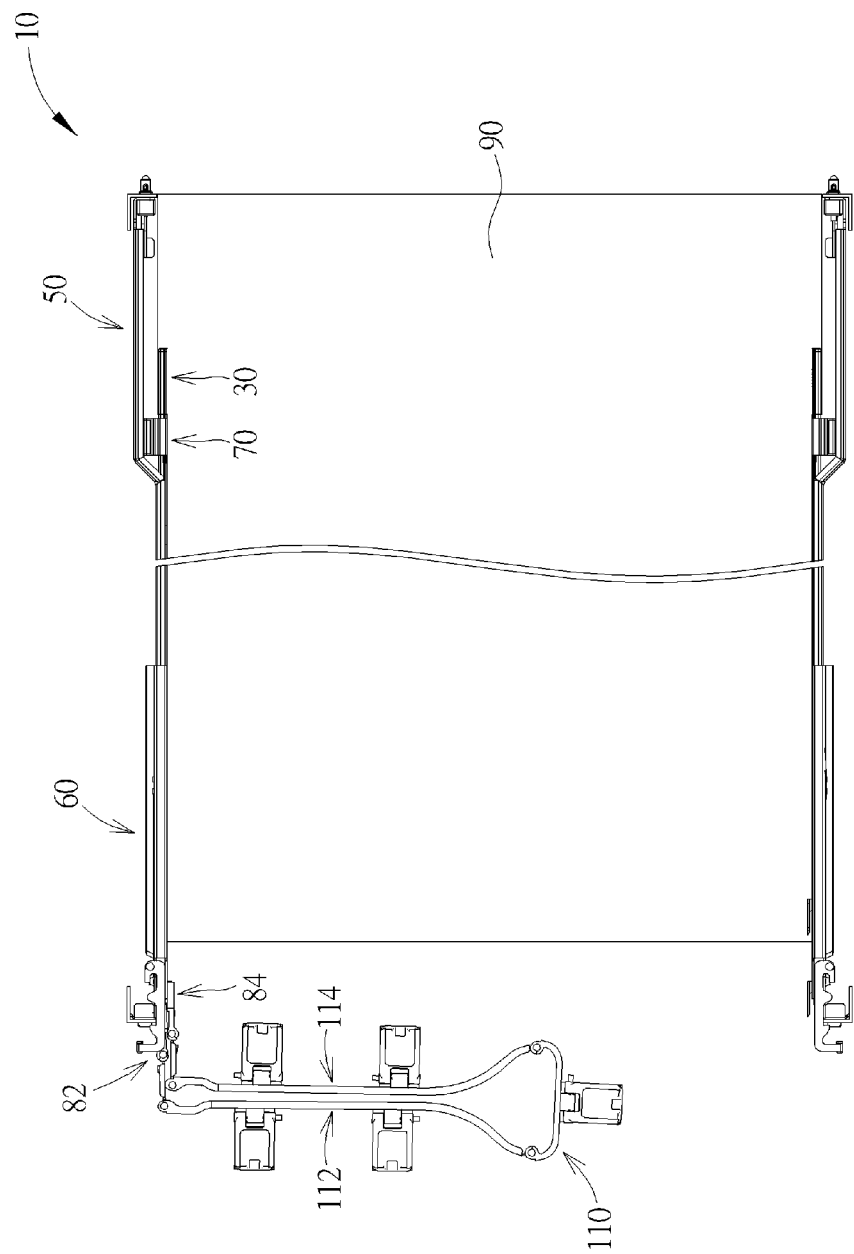
FIG. 4 is a diagram showing a folded cable management device when the chassis is stored in the rack.

Referring to FIG. 3, FIG. 3 is a diagram showing the slide rail assembly of an embodiment of the present invention configured to install a chassis onto a rack. The first bracket 50 is configured to attach to a first post 102 of the rack, and the second bracket 60 is configured to attach to a second post 104 of the rack, such that the slide rail assembly 10 can be installed on the rack. Moreover, a chassis 90 can be mounted on the inner rail 40, such that the slide rail assembly 10 can allow the chassis 90 to be stored in the rack or drawn out from the rack. The chassis 90 comprises a first portion 92 and a second portion 94. The first portion 92 is wider than the second portion 94, and a side of the second portion 94 is mounted on the inner rail 40. In addition, the first connection base 82 is configured to connect to a first arm 112 of a cable management device 110, and the second connection base is configured to connect to a second arm 114 of the cable management device 110 movably connected to the first arm 112. Wherein, the first arm 112 and the second arm 114 can be pivotally connected to each other. The cable management device 110 can support cables connecting to a device arranged on the chassis 90. Moreover, as shown in FIG. 4, when the chassis 90 is stored in the rack, the cable management device 110 is folded.

Figure 5:
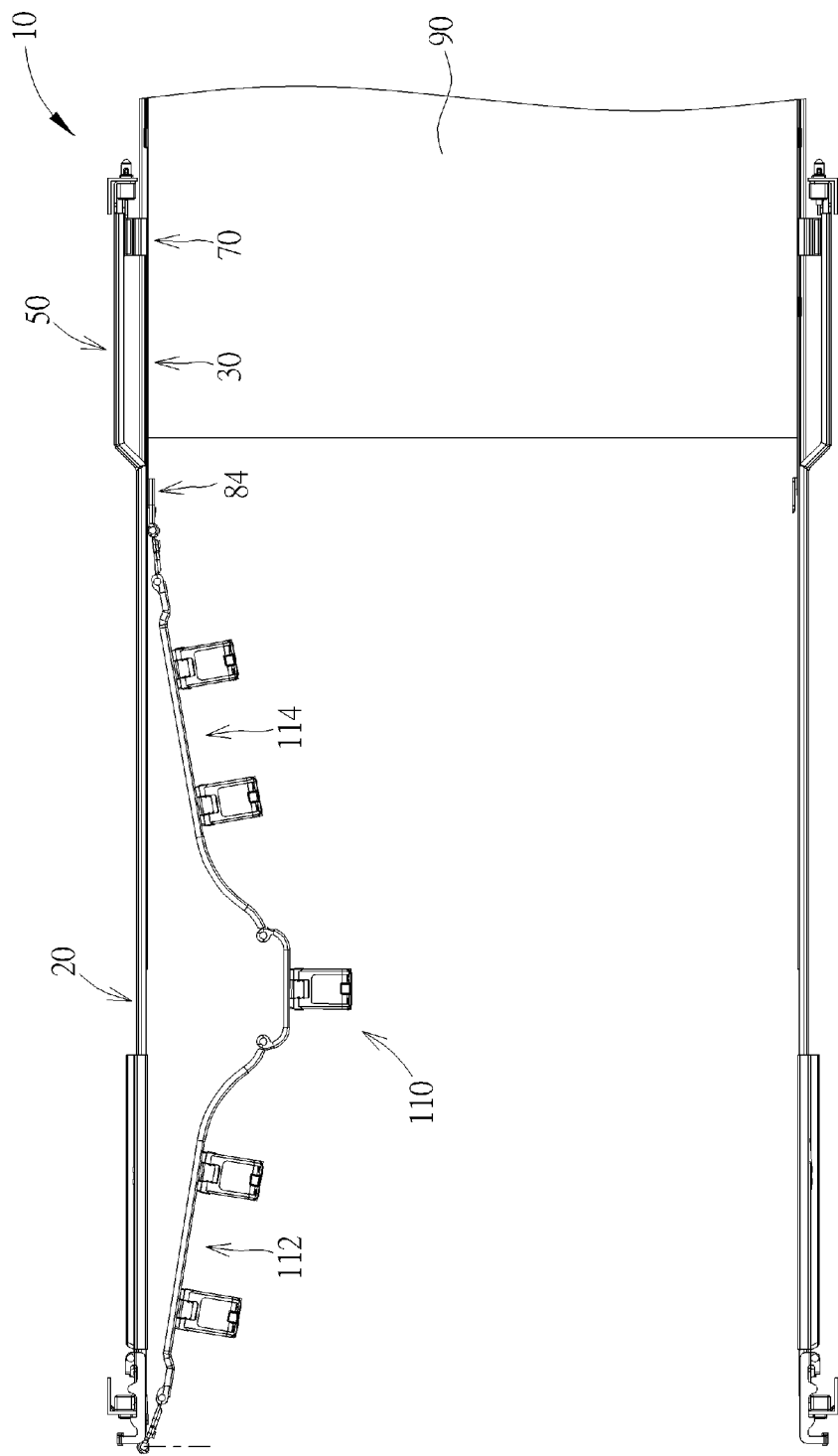
FIG. 5 is a diagram showing an end of the first arm of the cable management device located at a position on the outer rail.
Figure 6:
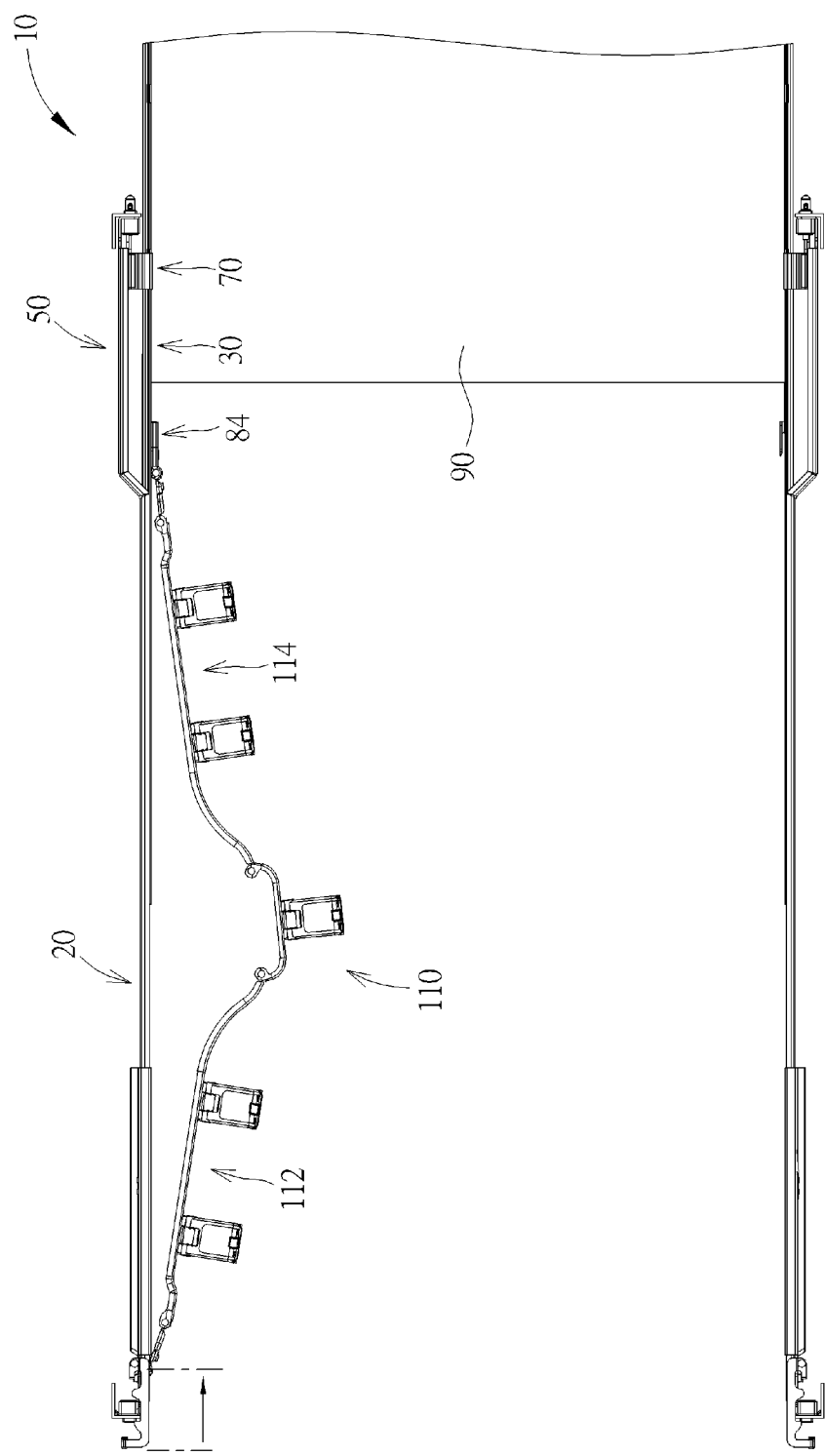
FIG. 6 is a diagram showing the end of the first arm of the cable management device located at another position on the outer rail.

According to the above arrangement, when the inner rail 40 is moved a predetermined distance outward along the first direction X, the first connection base 82 can be pulled by the inner rail 40 through the cable management device 110 to move in the first passage. As shown in FIG. 5 and FIG. 6, an end of the first arm 112 of the cable management device 110 can move on the slide rail assembly 10 when the chassis 90 is drawn out. In other words, both ends of the cable management device 110 can move with the inner rail 40 when the inner rail 40 is pulled out. Therefore, lengths of the first and second arms 112, 114 of the cable management device 110 can be reduced, such that a support member for supporting the cable management device 110 is not needed when the travel distance of the slide rail assembly 10 is increased.

Referring to FIG. 1 again, according to an embodiment of the present invention, the outer rail 20 can further comprises a stopper 86 for stopping the first connection base 82 when the first connection base 82 arrives at the position D. However, in other embodiment of the present invention, the stopper 86 is not necessary.

Figure 7:
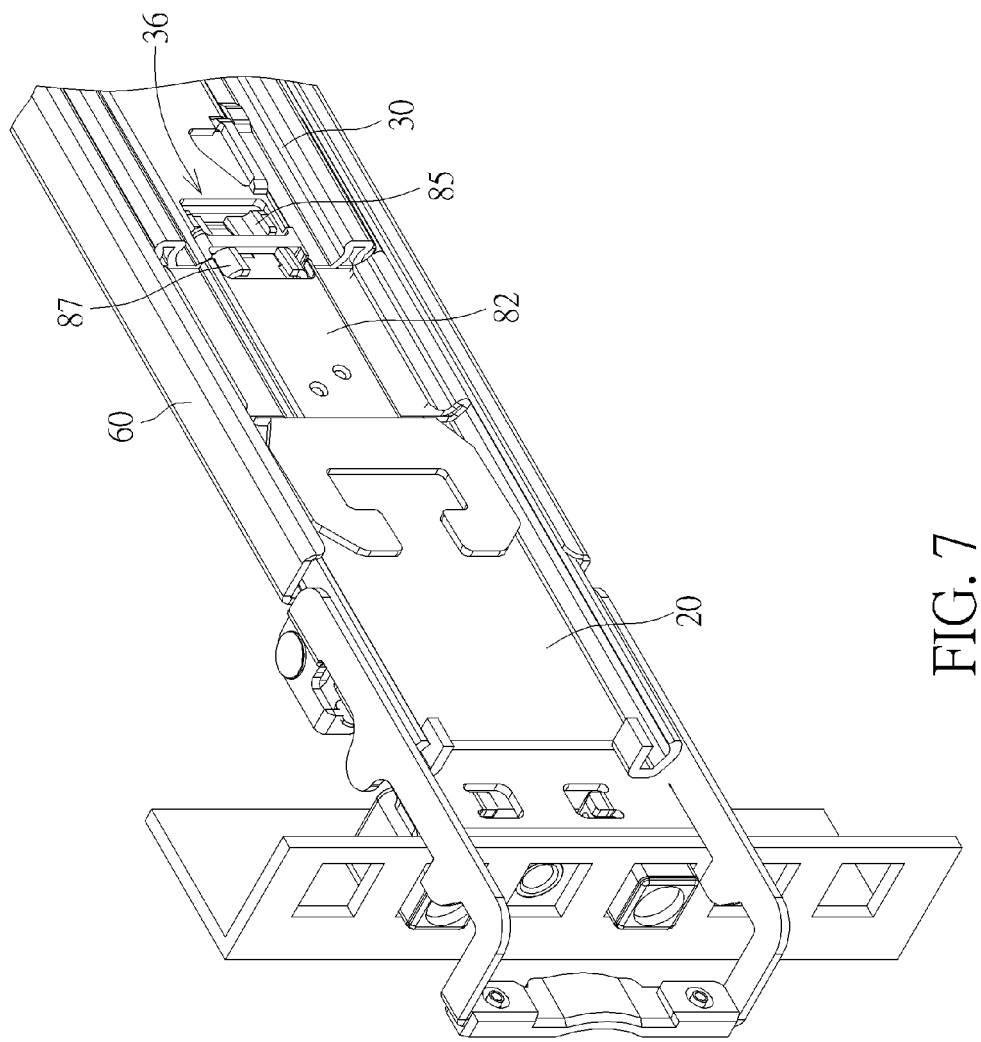
FIG. 7 and FIG. 8 are diagrams showing the first connection base comprising an elastic arm for engaging with the middle rail.
Figure 8:
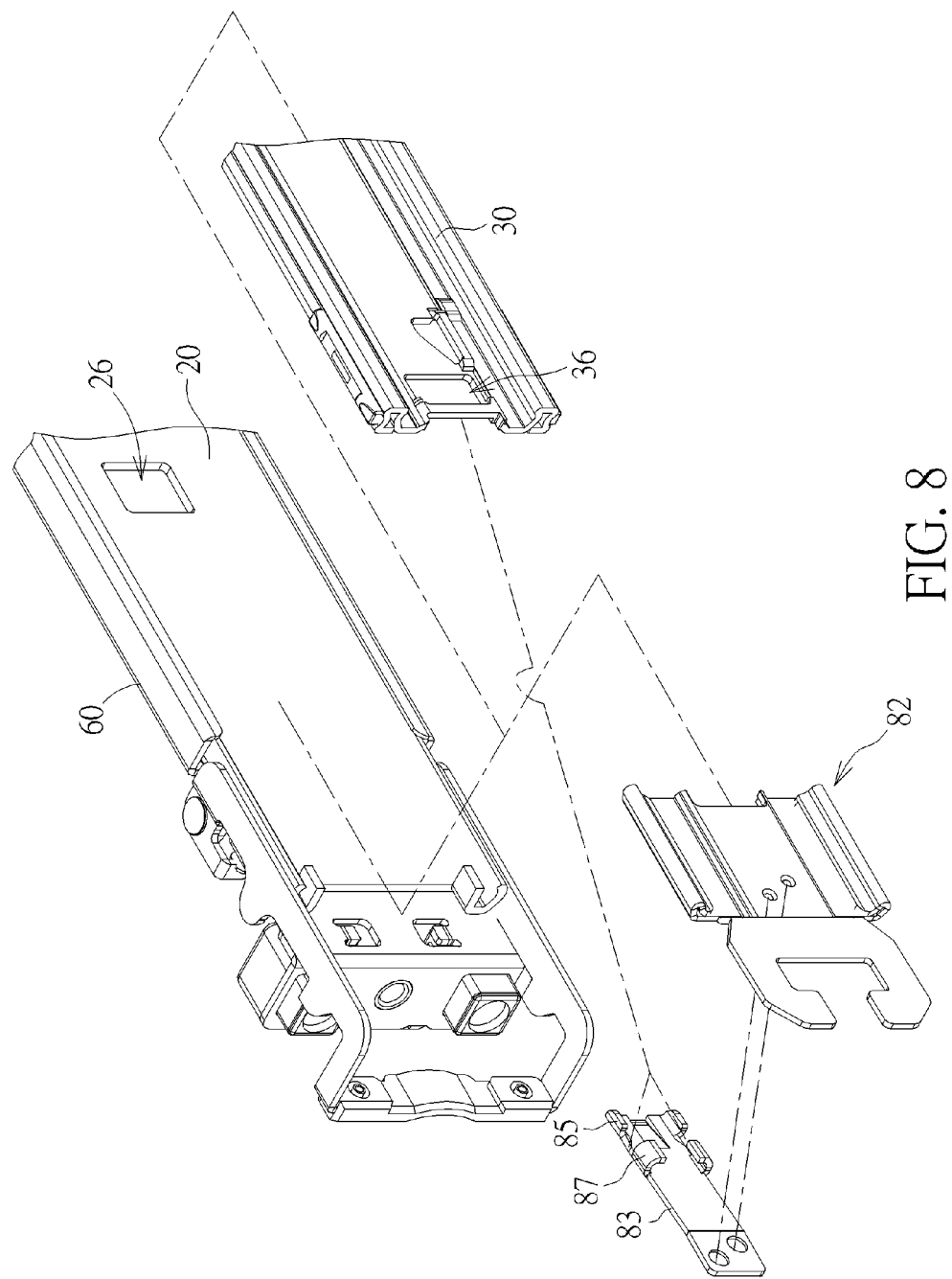
Figure 9:
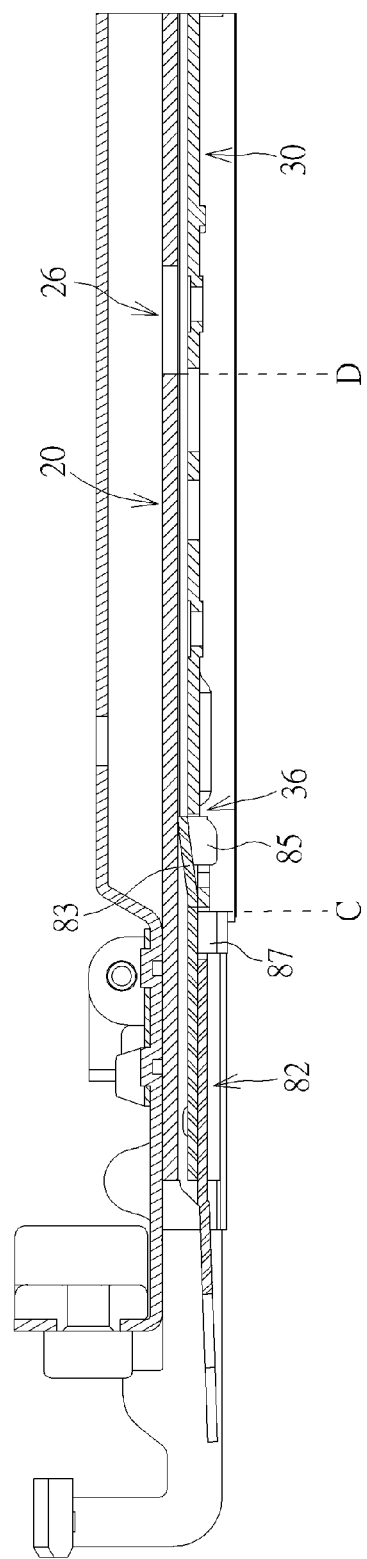
FIG. 9 is a diagram showing the first connection base engaged with the middle rail.
Figure 10:
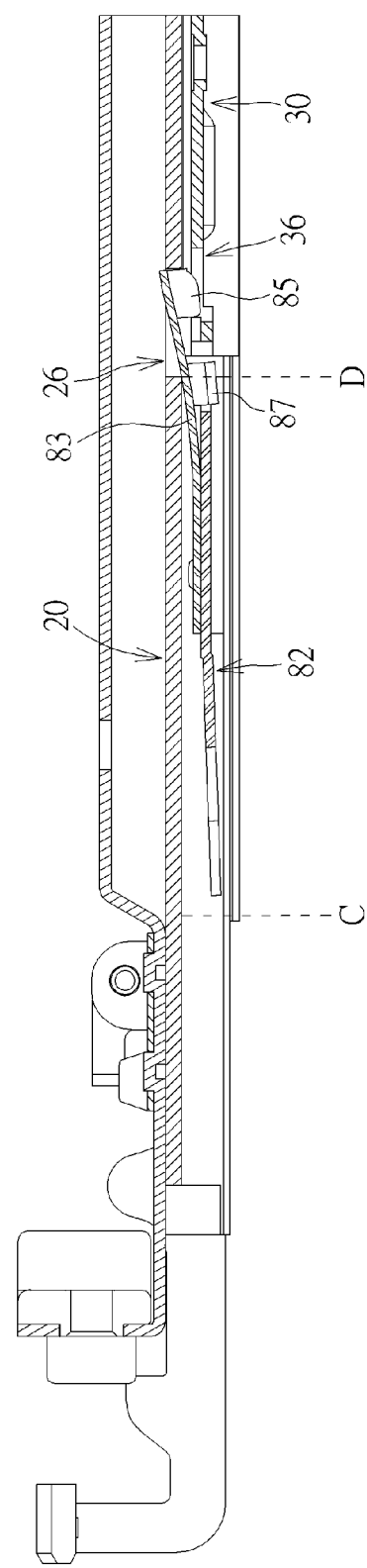
FIG. 10 is a diagram showing the first connection base released from the middle rail.

Referring to FIG. 7 and FIG. 8, FIG. 7 and FIG. 8 are diagrams showing the first connection base comprising an elastic arm for engaging with the middle rail. According to an embodiment of the present invention, the first connection base 82 can comprises an elastic arm 83, and a hook portion 85 of the elastic arm 83 can enter an opening 36 of the middle rail 30 for connecting the first connection base 82 and the middle rail 30. As shown in FIG. 9, when the first connection base 82 is not located at the position D, the elastic arm 83 is pressed to push the hook portion 85 of the elastic arm 83 into the opening 36 of the middle rail 30, such that the first connection base 82 is engaged with the middle rail 30 for moving with the middle rail 30. As shown in FIG. 10, when the first connection base 82 arrives at the position D, a releasing unit, such as a releasing hole 26 on the outer rail 20 can allow the elastic arm 83 to recover, such that the hook portion 85 of the elastic arm 83 moves out from the opening 36 of the middle rail 30 for releasing the elastic arm 83 from the middle rail 30, thus the first connection base 82 is no longer moved with the middle rail 30. Moreover, the elastic arm 83 can further comprise an abutting portion 87 configured to abut against the middle rail 30. Thus when the middle rail 30 is pushed toward the position C, the first connection base 82 can be pushed by the middle rail 30 for moving with the middle rail 30. However, the present invention is not limited to the above embodiment, the present invention can comprise other kind of structure for allowing the first connection base 82 to be connected to and released from the middle rail 30.

On the other hand, as shown in FIG. 1 and FIG. 2, the first bracket 50 can comprise two third sidewalls 52 and a third lateral wall 54 connected between the two third sidewalls 52. A third passage is defined by the two third sidewalls 52 and the third lateral wall 54 along the first direction X. The slide rail assembly 10 can further comprise a supporting base 70. The supporting base 70 comprises a first supporting portion 72 and a second supporting portion 74. The first supporting portion 72 comprises two supporting sidewalls 76 and a supporting lateral wall 78 connected between the two supporting sidewalls 76. The two supporting sidewalls 76 respectively correspond to the two second sidewalls 32 of the middle rail 30, and the supporting lateral wall 78 corresponds to the second lateral wall 34 of the middle rail 30. A supporting passage is defined by the two supporting sidewalls 76 and the supporting lateral wall 78 along the first direction X. The supporting passage corresponds to the first passage, and is configured to allow the middle rail 30 to move into the supporting passage. The second supporting portion 74 is movably connected to the first bracket 50 and is movable relative to the first bracket 50 in the third passage along the first direction X.

Figure 11:
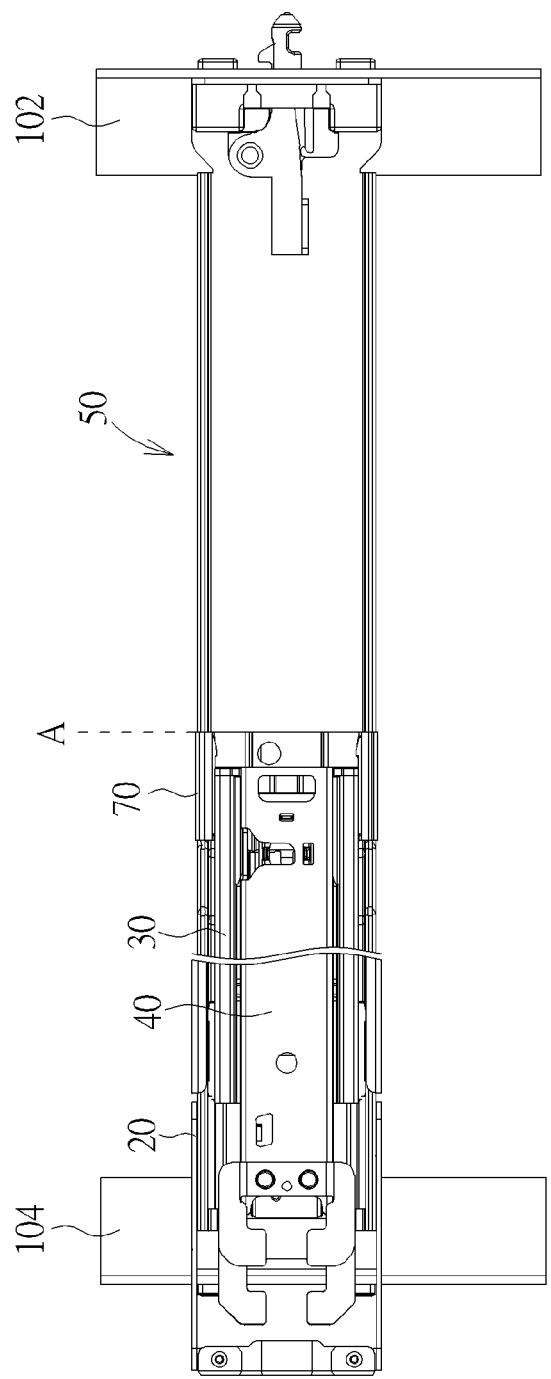
FIG. 11 is a diagram showing the supporting base located at a position on the first bracket.
Figure 12:
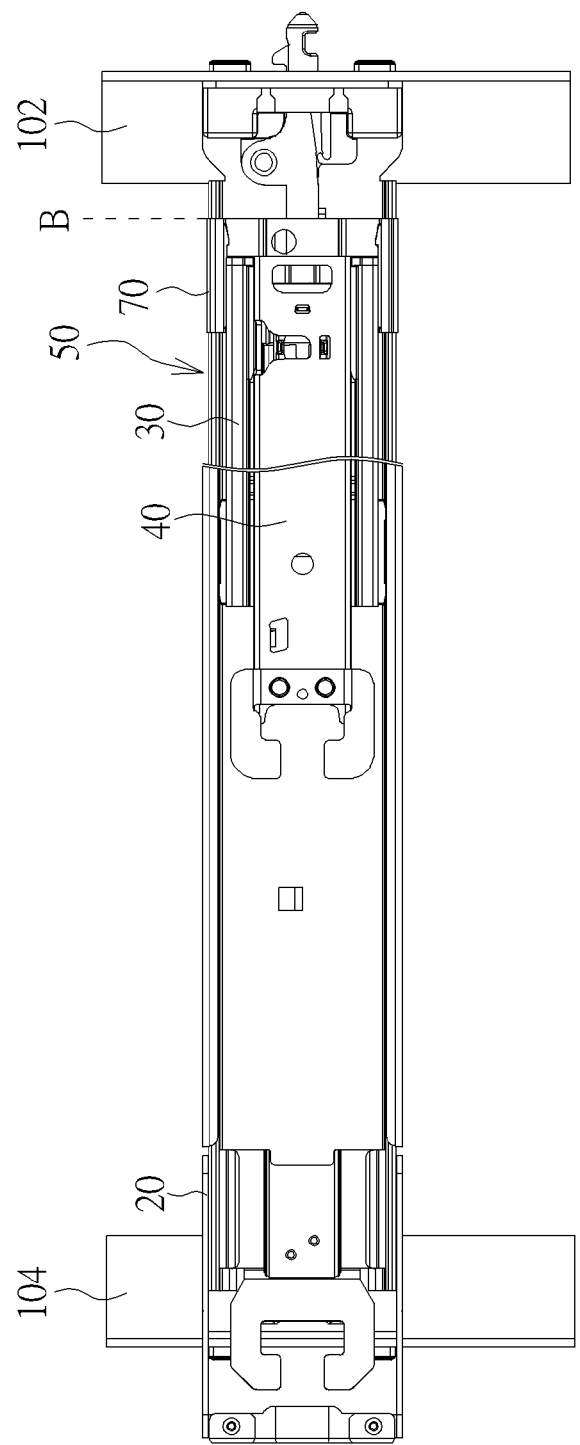
FIG. 12 is a diagram showing the supporting base located at another position on the first bracket.

According to the above arrangement, when the chassis 90 is drawn out from the rack, the middle rail 30 moves relative to the outer rail 20 in the first passage, and a portion of the middle rail 30 moves into the supporting passage for being supported by the first supporting portion 72 of the supporting base 70. As shown in FIG. 11 and FIG. 12, the supporting base 70 can move between a position A and a position B on the first bracket 50, for supporting the middle rail 30 when the middle rail 30 is pulled out. Therefore, the middle rail 30 is supported by both the outer rail 20 and the supporting base 70, such that the slide rail assembly 10 can carry the chassis 90 more stably when the chassis 90 is drawn out from the rack.

Figure 13:
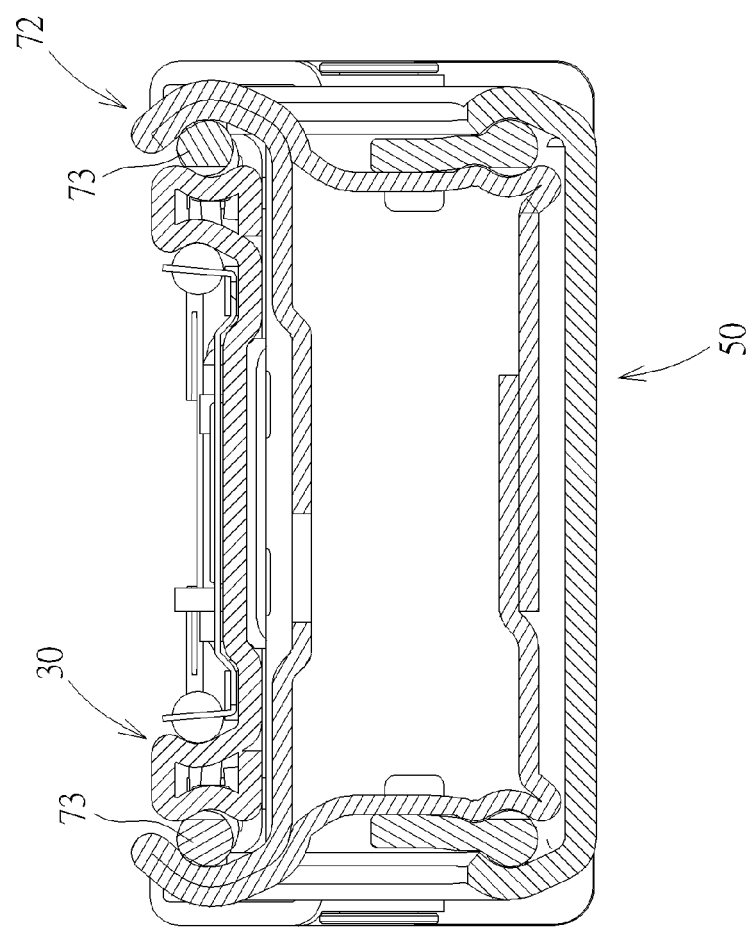
FIG. 13 is a cross-sectional view of the slide rail assembly along line 1-1 of FIG. 1 according to an embodiment of the present invention.

Referring to FIG. 13, FIG. 13 is a cross-sectional view of the slide rail assembly along line 1-1 of FIG. 1. The supporting base 70 can further comprise at least one contact piece 73 arranged on the first supporting portion 72. When the portion of the middle rail 30 moves into the supporting passage, the portion of the middle rail 30 contacts the contact piece 73 for driving the supporting base 70 to move along the first direction X relative to the first bracket 50. Therefore, when the chassis 90 is drawn outward, the supporting base 70 can be driven by the middle rail 30 to move to an outer position for providing better support. In other embodiment of the present invention, the supporting base 70 may not comprise the contact piece 73, that is, the supporting base 70 is not driven by the middle rail 30 to move when the chassis 90 is drawn outward. The supporting base 70 can also be moved manually.

In the above embodiment, the outer rail 20 and the first bracket 50 are integrally formed, and the outer rail 20 and the first bracket 50 are arranged at different planes along a second direction Y, where the second direction Y is perpendicular to the first direction X. According to the above arrangement, the outer rail 20 and the first bracket 50 can correspond to the shape of the chassis 90. However, the present invention is not limited to the above embodiment, the outer rail 20 and the first bracket 50 can be formed individually.

In addition, the present invention is not limited to the slide rail assembly comprising the outer rail, the middle rail and the inner rail. In other embodiment of the present invention, the middle rail can be omitted, and the inner rail can replace the middle rail to be movably connected to the outer rail and be movable relative to the outer rail in the first passage.

In contrast to the prior art, the slide rail assembly of the present invention comprises the first connection base movably arranged on the outer rail, for allowing both ends of the cable management device to move with the chassis when the chassis is drawn out from the rack. Therefore, lengths of the arms of the cable management device can be reduced, and the slide rail assembly of the present invention does not need a support member for supporting the cable management device when the travel distance of the slide rail assembly is increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A slide rail assembly, comprising:
  a first rail defining a first passage along a first direction;
  a first connection base movably connected to the first rail and movable relative to the first rail between a first position and a second position in the first passage;
  a second rail capable of moving relative to the first rail along the first direction; and
  a second connection base connected to the second rail;
  wherein the first rail comprises two first sidewalls and a first lateral wall connected between the two first sidewalls, the first passage is defined by the two first sidewalls and the first lateral wall, the slide rail assembly further comprises a middle rail movably connected to the first rail and movable relative to the first rail in the first passage, the middle rail comprises two second sidewalls and a second lateral wall connected between the two second sidewalls, a second passage is defined by the two second sidewalls and the second lateral wall along the first direction, the second rail is movably connected to the middle rail and movable relative to the middle rail in the second passage.

2. The slide rail assembly of claim 1, wherein the first connection base comprises an elastic arm configured to engage with the middle rail, and a releasing unit is arranged on the first rail for releasing the elastic arm from the middle rail when the first connection base is at the second position.

3. The slide rail assembly of claim 2, wherein the elastic arm further comprises an abutting portion configured to abut against the middle rail.

4. The slide rail assembly of claim 1, wherein the first rail further comprises a stopper for stopping the first connection base when the first connection base is at the second position.

5. A slide rail assembly, comprising:
  a first rail comprising two first sidewalls and a first lateral wall connected between the two first sidewalls, a first passage being defined by the two first sidewalls and the first lateral wall along a first direction;
  a first connection base movably connected to the first rail and movable relative to the first rail in the first passage, the first connection base configured to connect to a first arm of a cable management device;
  a second rail capable of moving relative to the first rail along the first direction; and
  a second connection base connected to the second rail, and configured to connect to a second arm of the cable management device movably connected to the first arm;
  wherein when the second rail is moved a predetermined distance outward along the first direction, the first connection base is pulled by the second rail through the cable management device to move from a first position toward a second position in the first passage.

6. The slide rail assembly of claim 5 further comprising a middle rail movably connected to the first rail and movable relative to the first rail in the first passage, the middle rail comprising two second sidewalls and a second lateral wall connected between the two second sidewalls, a second passage being defined by the two second sidewalls and the second lateral wall along the first direction, wherein the second rail is movably connected to the middle rail and movable relative to the middle rail in the second passage.

7. The slide rail assembly of claim 6, wherein the first connection base comprises an elastic arm configured to engage with the middle rail, and a releasing unit is arranged on the first rail for releasing the elastic arm from the middle rail when the first connection base is moved to the second position.

8. The slide rail assembly of claim 7, wherein the elastic arm further comprises an abutting portion configured to abut against the middle rail when the middle rail pushes the first connection base to move toward the first position.

9. The slide rail assembly of claim 5, wherein the first rail further comprises a stopper for stopping the first connection base when the first connection base is moved to the second position.

10. A slide rail assembly, configured to install a chassis on a rack, the slide rail assembly comprising:
   a first rail comprising two first sidewalls and a first lateral wall connected between the two first sidewalls, a first passage being defined by the two first sidewalls and the first lateral wall along a first direction;
   a first bracket connected to a first end of the first rail, and configured to attach to a first post of the rack;
   a second bracket connected to a second end of the first rail, and configured to attach to a second post of the rack;
   a first connection base movably connected to the first rail and movable relative to the first rail in the first passage, the first connection base configured to connect to a first arm of a cable management device;
   a middle rail movably connected to the first rail and movable relative to the first rail in the first passage, the middle rail comprising two second sidewalls and a second lateral wall connected between the two second sidewalls, a second passage being defined by the two second sidewalls and the second lateral wall along the first direction;
   a second rail movably connected to the middle rail and movable relative to the middle rail in the second passage, the chassis being mounted on the second rail; and
   a second connection base connected to the second rail, and configured to connect to a second arm of the cable management device movably connected to the first arm;
   wherein when the second rail is moved a predetermined distance outward along the first direction, the first connection base is pulled by the second rail through the cable management device to move from a first position toward a second position in the first passage.

11. The slide rail assembly of claim 10, wherein the first connection base comprises an elastic arm configured to engage with the middle rail, and a releasing unit is arranged on the first rail for releasing the elastic arm from the middle rail when the first connection base is moved to the second position.

12. The slide rail assembly of claim 10, wherein the first connection base further comprises an abutting portion configured to abut against the middle rail when the middle rail pushes the first connection base to move toward the first position.

13. The slide rail assembly of claim 10, wherein the first rail further comprises a stopper for stopping the first connection base when the first connection base is moved to the second position.

14. The slide rail assembly of claim 10, wherein the chassis comprises a first portion and a second portion, the first portion is wider than the second portion, and a side of the second portion is mounted on the second rail.

* * * * *